(12) United States Patent
Ahn et al.

(10) Patent No.: US 8,969,872 B2
(45) Date of Patent: Mar. 3, 2015

(54) THIN FILM TRANSISTOR DISPLAY PANEL

(71) Applicant: Samsung Display Co., Ltd., Yongin, Gyeonggi-Do (KR)

(72) Inventors: Byung Du Ahn, Hwaseong-si (KR); Ji Hun Lim, Goyang-si (KR); Jun Hyung Lim, Seoul (KR); Dae Hwan Kim, Seoul (KR); Jae Hyeong Kim, Seoul (KR); Je Hun Lee, Seoul (KR); Hyun Kwang Jung, Seoul (KR)

(73) Assignees: Samsung Display Co., Ltd. (KR); Kookmin University Industry Academy Cooperation Foundation (KR)

( * ) Notice: Subject to any disclaimer, the term of this patent is extended or adjusted under 35 U.S.C. 154(b) by 1 day.

(21) Appl. No.: 13/789,335

(22) Filed: Mar. 7, 2013

(65) Prior Publication Data

US 2014/0103332 A1    Apr. 17, 2014

(30) Foreign Application Priority Data

Oct. 16, 2012    (KR) .................. 10-2012-0115045

(51) Int. Cl.
*H01L 29/04*    (2006.01)
*H01L 29/786*    (2006.01)
*H01L 21/28*    (2006.01)

(52) U.S. Cl.
CPC ...... *H01L 29/7869* (2013.01); *H01L 29/78678* (2013.01); *H01L 29/78696* (2013.01); *H01L 21/28* (2013.01); *H01L 29/786* (2013.01)
USPC ................................. 257/57; 257/43; 257/79

(58) Field of Classification Search
CPC .............. H01L 29/04; H01L 29/78696; H01L 29/66765; H01L 29/78618; H01L 29/4908; H01L 21/28; H01L 29/786
USPC .......................................................... 257/43
See application file for complete search history.

(56) References Cited

U.S. PATENT DOCUMENTS 5,972,527 A    10/1999    Kaijou et al.
6,727,522 B1    4/2004    Kawasaki et al.
7,145,174 B2    12/2006    Chiang et al.

(Continued)

FOREIGN PATENT DOCUMENTS

JP    11-145477    5/1999
KR    100209639 B1    4/1999

(Continued)

*Primary Examiner* — Matthew Reames
*Assistant Examiner* — Vincent Wall
(74) *Attorney, Agent, or Firm* — Innovation Counsel LLP

(57) ABSTRACT

A thin film transistor display panel a includes a transparent substrate; a gate electrode positioned on the substrate; a gate insulating layer positioned on the gate electrode; a semiconductor layer positioned on the gate insulating layer and including a channel region; a source electrode and a drain electrode positioned on the semiconductor layer and facing each other; and a passivation layer configured to cover the source electrode, the drain electrode, and the semiconductor layer, wherein the semiconductor layer includes a relatively thick first portion between the source electrode and the gate electrode and a relatively thinner second portion between the drain electrode and the gate electrode overlap, the relatively thick first portion being sufficiently thick to substantially reduce a charge trapping phenomenon that may otherwise occur at a gate electrode to gate dielectric interface if the first portion were as thin as the second portion.

18 Claims, 4 Drawing Sheets

(56) References Cited

U.S. PATENT DOCUMENTS

| | | |
|---|---|---|
| 7,189,992 B2 | 3/2007 | Wager, III et al. |
| 7,242,039 B2 | 7/2007 | Hoffman et al. |
| 7,297,977 B2 | 11/2007 | Hoffman et al. |
| 7,382,421 B2 | 6/2008 | Hoffman et al. |
| 7,453,087 B2 | 11/2008 | Iwasaki |
| 7,626,665 B2 | 12/2009 | Koike |
| 7,633,164 B2 | 12/2009 | Koike et al. |
| 7,642,552 B2 | 1/2010 | Koike et al. |
| 7,782,413 B2 | 8/2010 | Koike et al. |
| 7,782,433 B2 | 8/2010 | Koike |
| 7,791,072 B2 | 9/2010 | Kumomi et al. |
| 7,791,074 B2 | 9/2010 | Iwasaki |
| 7,863,611 B2 | 1/2011 | Abe et al. |
| 7,868,326 B2 | 1/2011 | Sano et al. |
| 7,906,777 B2 | 3/2011 | Yano et al. |
| 7,956,361 B2 | 6/2011 | Iwasaki |
| 7,998,372 B2 | 8/2011 | Yano et al. |
| 8,049,225 B2 | 11/2011 | Yamazaki et al. |
| 8,089,158 B2 | 1/2012 | Koike et al. |
| 8,471,255 B2 * | 6/2013 | Okabe ............................ 257/57 |
| 2005/0017244 A1 | 1/2005 | Hoffman et al. |
| 2007/0090365 A1 | 4/2007 | Hayashi et al. |
| 2008/0073653 A1 * | 3/2008 | Iwasaki ........................... 257/79 |
| 2009/0189155 A1 | 7/2009 | Akimoto |
| 2009/0218568 A1 * | 9/2009 | Dairiki et al. .................... 257/57 |
| 2009/0278122 A1 | 11/2009 | Hosono et al. |
| 2009/0286386 A1 * | 11/2009 | Lee et al. ....................... 438/586 |
| 2010/0025676 A1 | 2/2010 | Yamazaki et al. |
| 2010/0025678 A1 | 2/2010 | Yamazaki et al. |
| 2010/0025679 A1 | 2/2010 | Yamazaki et al. |
| 2010/0085081 A1 | 4/2010 | Ofuji et al. |
| 2010/0295041 A1 | 11/2010 | Kumomi et al. |
| 2010/0295042 A1 | 11/2010 | Yano et al. |
| 2011/0012107 A1 | 1/2011 | Sano et al. |
| 2011/0024741 A1 | 2/2011 | Abe et al. |
| 2011/0057257 A1 | 3/2011 | Park et al. |
| 2011/0062992 A1 | 3/2011 | Okazaki et al. |
| 2011/0114947 A1 | 5/2011 | Iwasaki |
| 2011/0127526 A1 | 6/2011 | Kawae et al. |
| 2011/0193082 A1 | 8/2011 | Iwasaki |

FOREIGN PATENT DOCUMENTS

| | | |
|---|---|---|
| KR | 1020020017781 A | 3/2002 |
| KR | 1020100032224 A | 3/2010 |
| KR | 1020110027472 A | 3/2011 |
| KR | 1020110058076 A | 6/2011 |
| KR | 1020110061419 A | 6/2011 |
| KR | 1020110071641 A | 6/2011 |

* cited by examiner

THIN FILM TRANSISTOR DISPLAY PANEL

CROSS-REFERENCE TO RELATED APPLICATION

This application claims priority to and the benefit of Korean Patent Application No. 10-2012-0115045 filed in the Korean Intellectual Property Office on Oct. 16, 2012, the entire contents of which application are incorporated herein by reference.

BACKGROUND (a) Technical Field

The present disclosure of invention relates to a thin film transistor display panel and to a transistor structure usable therein.

(b) Description of Related Technology

Thin film transistors (TFT's) are routinely used in flat or curved panel display devices such as liquid crystal display (LCD) ones, organic light emitting diode display (OLED) ones, electrophoretic displays, plasma displays, and so forth. Such display devices generally include an opposed pair of electric field generating electrodes configured for generating an electric field therebetween and one or more electro-optical active layers that are subject to the generated electric field. One or more optical characteristics of the electro-optical active layer(s) changes in response to the creation and/or strength of the generated electric field. In the liquid crystal display (LCD) devices for example, a liquid crystal material layer serves as the electro-optical active layer, and an orientation of the liquid crystal molecules is typically modulated by the generated electric field. In the organic light emitting diode (OLED) type displays an organic light emitting layer typically serves as the electro-optical active layer and light is emitted as a function of current induced by the generated electric field. In these and the various other types of TFT-using displays, one of the pair of electric field generating electrodes is typically connected to an electronic switching device that includes at least one thin film transistor (TFT) used for selectively applying a received electrical signal to at least one of the electrodes, where the electro-optical active layer converts the selectively applied electrical signal to an optics-affecting attribute and thus controls the display of a desired image.

More specifically, the typical flat or curved panel display includes a substrate on which one or more thin film transistors (TFT's) are integrally formed and electrical performance of the these integrally formed TFT's can greatly affect display performance. During mass production fabrication of the TFT's, multiple layers of electrode-forming conductors, of semiconductive material, and the like are photo-lithographically defined and shaped (patterned) in accordance with the photo-lithographical based patterning where at least one photo-lithography mask is generally used in the patterning process and one or more etch masks may also be used in the patterning process.

In the meantime, and as alluded to above, the semiconductive material that is used in formation of the TFT's plays a significant role in determining electrical characteristics of the formed thin film transistors. Amorphous silicon (Si-a) is one example of much used semiconductive material. However, a charge mobility attribute of Si-a tends to be undesirably low, so that it becomes difficult to mass produce high performance thin film transistors while using amorphous silicon (Si-a). On the other hand, when a more organized crystalline material such as polysilicon (Si-p) is used, charge mobility tends to be substantially higher, so that it becomes easier to mass produce high performance thin film transistors when using the more crystalline-wise organized polysilicon material. However, a cost of producing polysilicon tends to be high as compared to amorphous silicon (Si-a) and uniformity over large areas of the produced polysilicon (Si-p) may be low, so that there is a limitation in manufacturing a large thin film transistor display panel (for example for use in large area TV screens) while using only polysilicon (Si-p) for the entire area of the large-area TFT display panel.

Another type of semiconductive material that may be used (instead of Si-a or Si-p) comes from a class of oxides known as semiconductive oxides. Research has been ongoing on thin film transistors that use an appropriate one or more semiconductive oxides for attaining a higher charge mobility (higher than that of amorphous silicon), a higher ON/OFF ratio of current (better control over leakage current), a cost that is lower than that of polysilicon, and high uniformity of electrical characteristics when used in mass production of large area display panels.

It has been found that if a channel length in the thin film transistor using a semiconductive oxide (SOx) is short, there is a problem in that charge mobility deteriorates due for example to influence of a fringing field created by use of a high source bias. Moreover, during the mass production process, an upper portion of the SOx layer may be damaged when source/drain electrodes are etched by a corresponding one or more etch processes. When such damage occurs to the so-called, back surface of the channel portion of the SOx-based TFT, reliability of the thin film transistor display panel tends to deteriorate and becomes difficult to mass produce large area display panels of consistent quality while using semiconductive oxide based TFT's.

It is to be understood that this background of the technology section is intended to provide useful background for understanding the here disclosed technology and as such, the technology background section may include ideas, concepts or recognitions that were not part of what was known or appreciated by those skilled in the pertinent art prior to corresponding invention dates of subject matter disclosed herein.

SUMMARY

The present disclosure of invention provides a thin film transistor display panel having improved reliability without deterioration of charge mobility and of a characteristic of ON-current (e.g., shifting of a TFT threshold voltage).

An exemplary embodiment provides a thin film transistor display panel including: a substrate; a gate electrode positioned on the substrate; a gate insulating layer positioned on the gate electrode; a semiconductor layer (e.g., a semiconductive oxide layer) positioned on the gate insulating layer and including a channel region; and a source electrode and a drain electrode positioned on the semiconductor layer and facing each other, wherein the semiconductor layer includes a first portion of which overlaps both the source electrode and the gate electrode and a second portion of which overlaps both the drain electrode and the gate electrode; the first portion comprising a hill portion protruding.

The source electrode positioned on the first portion of the semiconductor layer may be positioned while being retreated from an edge of the hill portion.

The channel region may be positioned between the source electrode and the drain electrode.

The thin film transistor display panel may further include a passivation layer disposed over the source electrode and the drain electrode; wherein a first portion of the passivation layer overlaps the first portion of the semiconductor layer and the first portion of the passivation layer is higher than a second portion of the passivation layer overlapping the second portion of the semiconductor layer.

The passivation layer may cover a portion of the semiconductor layer exposed between the source electrode and the drain electrode.

The thickness of the first portion of the semiconductor layer may be larger than a thickness of the second portion of the semiconductor layer.

The hill portion may have a thickness equal to or more than about 20 nm and less than or equal to about 50 nm.

The thin film transistor display panel may further include an etching prevention layer covering the channel portion of the semiconductor layer.

The etching prevention layer may overlap the source electrode and the drain electrode at both edges of the etching prevention layer.

The etching prevention layer may overlap the hill portion of the semiconductor layer.

One edge of the etching prevention layer may protrude upwardly.

The hill portion, the one edge of the etching prevention layer, and a terminal edge of the source electrode may overlap one another.

When it is assumed that a thickness of the hill portion is a value obtained by subtracting the thickness of the second portion of the semiconductor layer from the thickness of the first portion of the semiconductor layer, the thickness of the hill portion is equal to or more than about 20 nm and equal to or less than about 50 nm.

A width of a portion at which the one edge of the etching prevention layer may overlap the hill portion of the semiconductor layer is equal to or less than about 5 μm.

A width of a portion at which the edge of the source electrode overlaps the one edge of the etching prevention layer may be equal to or less than about 7.5 μm.

The source electrode positioned on the first portion of the semiconductor layer may be positioned while being retreated from the hill portion based on the channel region of the semiconductor layer.

The semiconductor layer may include a semiconductive oxide.

The thin film transistor display panel may further include a passivation layer disposed over the source electrode and the drain electrode; a pixel electrode disposed on the passivation layer, and wherein the passivation layer has a contact hole, and the pixel electrode is connected with the drain electrode through the contact hole.

According to the exemplary embodiments of the present disclosure of invention, the source electrode having a large thickness to which a bias voltage is applied in the channel region in which current flows is formed, thereby decreasing a vertical field generating charge trapping. Accordingly, reliability of a device may be improved.

DETAILED DESCRIPTION

Figure 1:
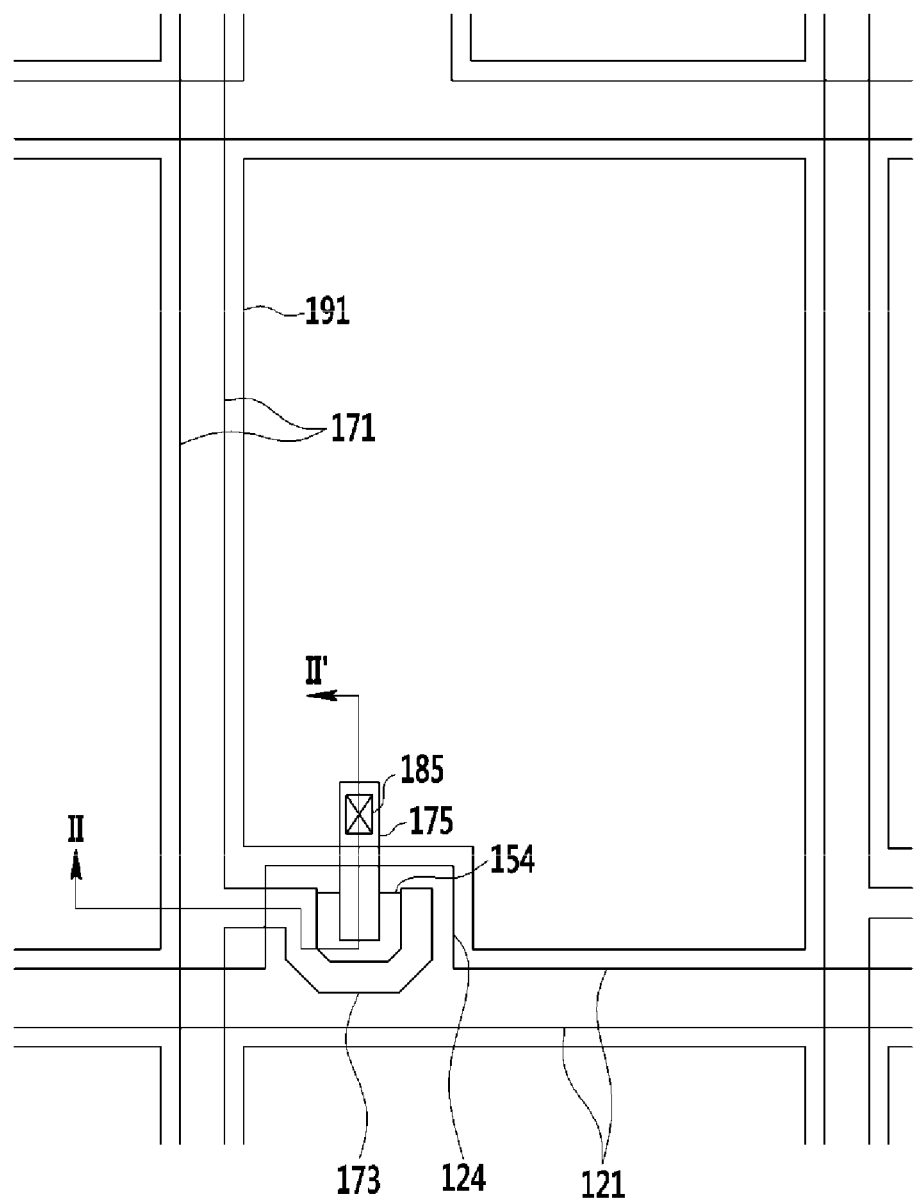
FIG. 1 is a top plan view illustrating a thin film transistor display panel according to an exemplary embodiment of the present disclosure of invention.

Hereinafter, an exemplary embodiment in accordance with the present disclosure of invention will be described in detail with reference to the accompanying drawings. However, the present teachings are not limited to the exemplary embodiments used herein and may be implemented in other forms. Rather, the embodiments introduced herein are provided so as to make the disclosed contents thorough and complete and to fully transfer the spirit of the present teachings to those skilled in the pertinent art.

In the drawings, thicknesses of layers and regions are exaggerated for accuracy. Further, when it is said that a layer is formed on another layer or a substrate, the layer may be directly formed on another layer or the substrate, or may be formed on another layer or the substrate with a third layer interposed therebetween. Further, throughout this specification, parts indicated by the same reference number mean the same constituent elements.

Figure 2:
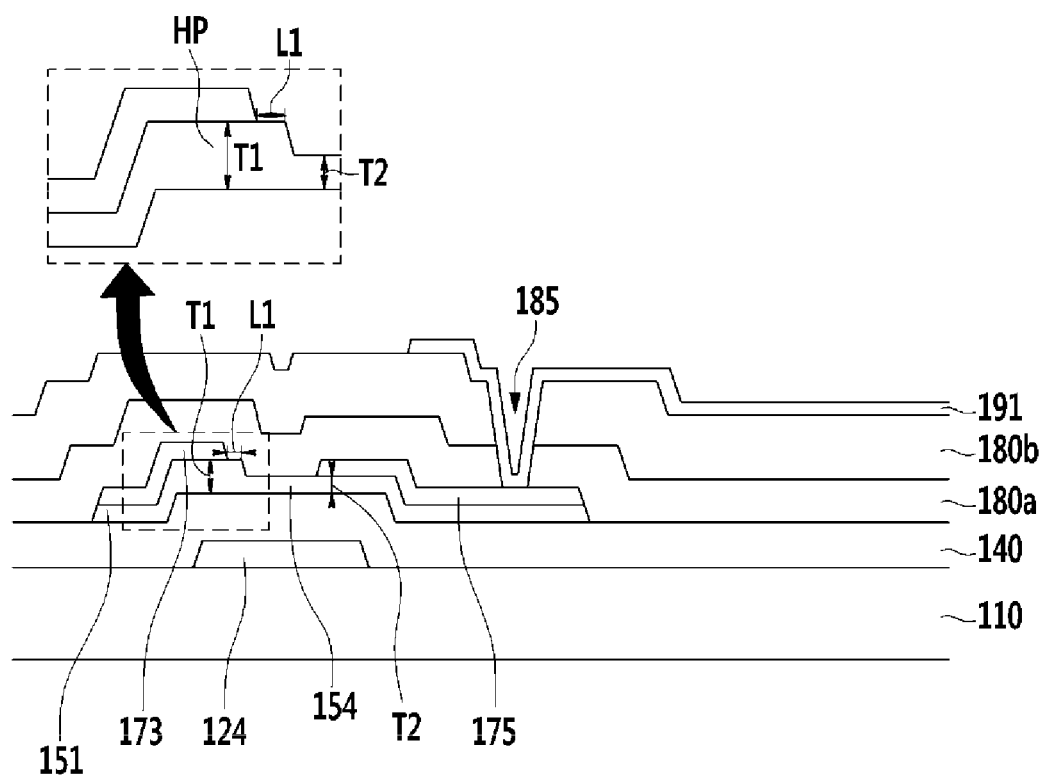
FIG. 2 is a cross-sectional view taken along line II-II' of FIG. 1.

FIG. 1 is a top plan view illustrating a thin film transistor display panel according to a first exemplary embodiment of the present disclosure of invention. FIG. 2 is a cross-sectional view taken along line II-II' of FIG. 1.

Referring to FIGS. 1 and 2, a plurality of spaced apart and parallel-wise extending gate lines 121 are formed on an electrically insulative substrate 110 where the latter may be formed of a transparent glass or plastic.

The gate lines 121 transmit gate signals, and primarily extend in a horizontal direction (also X direction herein). Each gate line 121 has a plurality of gate electrodes 124 (one shown) integrally branching out from the gate line 121.

The gate lines 121 and their corresponding gate electrodes 124 may be formed of one or more selected conductors such as, an aluminum-based metal, such as aluminum (Al) and/or an aluminum alloy, a silver-based metal, such as silver (Ag) and/or a silver alloy, and such as a copper-based metal, such as copper (Cu) and/or a copper alloy.

In the present exemplary embodiment, it is described that the gate line 121 and the gate electrode 124 are formed as a single layer, but the gate line 121 and the gate electrode 124 are not limited thereto and may be formed as dual conductive layers, triple layers, or other such multi-layered configurations.

When the gate line 121 and the gate electrode 124 have a dual-layered structure, the gate line 121 and the gate electrode 124 may be formed of a lower layer and an upper layer, where the lower layer may be formed of one selected from molybdenum-based metal, such as molybdenum and a molybdenum alloy, chromium (Cr), a chromium alloy, titanium (Ti), a titanium alloy, tantalum (Ta), a tantalum alloy, manganese (Mn), and a manganese alloy. The upper layer may be formed of one selected from aluminum-based metal, such as aluminum (Al) and an aluminum alloy, silver-based metal, such as silver (Ag) and a silver alloy, and copper-based metal, such as copper (Cu) and a copper alloy. In a case of a triple layer structure, layers having different physical properties may be combined.

A gate insulating layer 140 is formed on the gate line 121 and on its monolithically integrated gate electrodes 124. The gate insulating layer 140 may be formed of a silicon oxide and/or a silicon nitride and/or a silicon oxynitride (SiOxNy). In the present exemplary embodiment, it is described that the gate insulating layer 140 is formed in a single layer form, but may be formed in a dual-layer form.

Particularly, the gate insulating layer 140 may include a first insulating layer and a second insulating layer positioned on the first insulating layer. The first insulating layer may be formed of a silicon nitride ($SiN_x$) having a thickness of approximately 4,000 Å, and the second insulating layer may be formed of a silicon oxide (SiOy) having a thickness of approximately 500 Å. As another exemplary embodiment, the first insulating layer may be formed of silicon oxynitride (SiOxNy), and the second insulating layer may be formed of a silicon oxide (e.g., $SiO_2$).

A plurality of semiconductor layers 151 formed of an semiconductive oxide are formed on the gate insulating layer 140 to overlie corresponding ones of the gate electrodes 124. The semiconductor layers 151 each predominantly extends in the vertical (Y axis) direction of FIG. 1 (as does a soon-described, drain electrode 175), and includes a plurality of projections 154 extending over and conforming to the shape of the underlying gate electrode 124.

The semiconductive oxide according to the present exemplary embodiment includes oxygen chemically combined with at least one of tantalum (Ta), zinc (Zn), indium (In), tin (Sn), gallium (Ga), and hafnium (Hf).

A plurality of data lines 171 are provided extending orthogonally (in the Y direction) to cross with the gate lines 121. A plurality of hook-shaped source electrodes 173 (one shown) integrally branch out from the corresponding data lines 171. As seen in FIG. 1, the hook shape may include a U-shaped portion corresponding to a source region of the respective semiconductive oxide based TFT. An elongated drain electrode 175 (elongated in the Y direction) is disposed at a position facing the interior of the hook-shaped source electrode 173 where both of the source electrode and drain electrode 175 are formed on top of the semiconductor layers 151. Although not shown, it is within the contemplation of the present disclosure to include ohmic contacts or barrier layers between the semiconductor layers 151 and the source and/or drain electrodes 173/175.

As will be appreciated from FIG. 2 by those skilled in the art, the portion of the illustrated semiconductor layer 151 disposed between the spaced apart source and drain electrodes 173/175 and disposed insulatively above the gate electrode 124 may function as a channel portion of the respective TFT. In accordance with the present disclosure, that channel portion of the semiconductor layer 151 includes a first thickness portion (T1) and a second thickness portion (T2) having respective and different first and second thicknesses, T1 and T2. The first thickness portion (T1) is disposed under and slightly beyond (by distance L1) the interior edge of the U-shaped portion of the source electrode 173 and further overlaps a corresponding portion of the gate electrode 124. The second thickness portion (T2) extends from where the first thickness portion (T1) ends to an area of the semiconductor layer 151 overlapped by the drain electrode 175. The second thickness portion (T2) also overlaps the gate electrode 124. In other words, the semiconductor layer 151 has a channel portion that includes both the first thickness portion (T1) and the second thickness portion (T2) and the channel portion overlaps the gate electrode 124 such that the first and second thickness portions (T1 and T2) are capacitively coupled to the gate electrode 124 by way of a constant thickness portion of the gate insulating layer 140 that conformably overlies the top of the gate electrodes 124.

More specifically and as shown in FIG. 2, the first thickness portion (T1) of the semiconductor layer 151 defines a hill portion HP that protrudes upwardly to a higher level than that of the top surface of the second thickness portion (T2). The hill portion HP is adjacently positioned to the source electrode 173 to which a respective source bias voltage ($V_s$) is applied, and the hill portion HP occupies a portion of a Z-direction distance between the bottom of the source electrode 173 and the top of the gate electrode 124. Accordingly, a separation distance between the bottom of the source electrode 173 and the top of the gate electrode 124 is equal to the thickness of the gate insulating layer 140 increased by the thickness (T2) of the hill portion HP. When a predetermined gate-biasing voltage, $V_{gs}$ is applied between the gate and source electrodes, a corresponding vertical electrical field is generated having a respective field intensity measured in volts per unit of distance. Most of that field intensity will be dissipated in the dielectric material of the gate insulating layer 140. But some of it will be dissipated in the semiconductive material of the hill portion HP of the semiconductor layer 151. The decrease of the field intensity due to the second thickness T2 of the hill portion HP is believed to lead to a decrease of charge trapping at the interface between the bottom surface of the projection 154 of the semiconductor layer 151 and the gate insulating layer 140. Accordingly, an electrical performance stability of the device may be improved relative to TFT's which do not have such an anti-trapping configuration.

More specifically, when the gate-biasing voltage, $V_{gs}$ is switched to the TFT turning on level ($V_{Gon}$) and electrical current begins to flow from the bottom of the source electrode 173 towards the top of the gate electrode 124 and also towards the drain electrode 175, more of that electrical current (e.g., drifting charge carriers) are able to flow into the thinner second thickness portion (T2) of the channel portion without being trapped at the channel to dielectric interface (IF) formed where the bottom of the channel portion meets the top of the gate insulating layer 140 and electrical performance characteristics of the semiconductive oxide based TFT is improved thereby. Yet more specifically, when the data line 171 transmits a data signal as current moving from the source electrode 173 and through the channel portion towards the drain electrode 175, that current mainly extends in a lateral direction toward the drain electrode 175 and not in a Z-direction that aims its charges carriers into being possibly trapped at the dielectric-to-semiconductive material interface formed at the junction of the semiconductor layer 151 and the gate insulating layer 140.

As mentioned above, the drain electrode 175 is patterned to be separate from the data line 171, and it extends in the Y direction of FIG. 1 to enter a center and interior portion of the U-shape of the source electrode 173. The illustrated shapes of the source electrode 173 and the drain electrode 175 are of course just one possible example, and may be variously modified. Due to the U-shape of the source electrode 173, the flow of charge carriers (when the TFT is turned on) may be evenly distributed along the interior portion of the U-shaped source electrode 173 for subsequent flow towards the drain electrode 175 and charge density is thus distributed so that there is less of a probability of charge being converted into trapped ions at the interface (IF) formed at the junction of the semiconductive region 151 and the gate insulating layer 140. (Such ion trapping is undesirable because it can alter the turn-on threshold voltage Vt of the TFT.)

During manufacture, a data wiring layer is patterned where that patterned data wiring layer includes the data line 171, a floating metal layer (TFM—not shown, but usable for forming so-called, floating gate transistors), the source electrode 173, and the drain electrode 175 and this patterned data wiring layer may include conductors selected from aluminum-based metal, such as aluminum (Al) and an aluminum alloy, silver-based metal, such as silver (Ag) and a silver alloy, copper-based metal, such as copper (Cu) and a copper alloy, molybdenum-based metal, such as molybdenum and a molybdenum alloy, chromium (Cr), a chromium alloy, titanium (Ti), a titanium alloy, tantalum (Ta), a tantalum alloy, manganese (Mn), and a manganese alloy.

In the present exemplary embodiment, the data line 171, the source electrode 173, and the drain electrode 175 are formed as patterned parts of a single layer, but the data line 171, the source electrode 173, and the drain electrode 175 are not limited thereto, and may be formed in a dual layer form or a triple layer form.

When the data line 171, the source electrode 173, and the drain electrode 175 have a dual-layer structure, the data line 171, the source electrode 173, and the drain electrode 175 may be formed of a lower layer and an upper layer, and the lower layer may include one selected from molybdenum-based metal, such as molybdenum and a molybdenum alloy, chromium (Cr), a chromium alloy, titanium (Ti), a titanium alloy, tantalum (Ta), a tantalum alloy, manganese (Mn), and a manganese alloy, and the upper layer may include one selected from aluminum-based metal, such as aluminum (Al) and an aluminum alloy, silver-based metal, such as silver (Ag) and a silver alloy, copper-based metal, such as copper (Cu) and a copper alloy. In a case of a triple layer structure, layers having different physical properties may be combined.

The projection 154 of the semiconductor layer 151 has a portion which is not hidden (covered) by the source electrode 173 and by the drain electrode 175 and is therefore exposed between the source electrode 173 and the drain electrode 175. The semiconductor layer 151 may be substantially at a same planar level as are the data line 171, and lower portions of the source electrode 173, of the floating metal layer TFM (not shown), and of the drain electrode 175, the exception being for the exposed portion of the elevated projection 154. That is, side walls of the data line 171, the source electrode 173, and the drain electrode 175 may be arranged to be the substantially same as side walls of the semiconductor layer 151 under the data line 171, the source electrode 173, and the drain electrode 175. The pattern is formed because the data wiring layer including the data line 171, the source electrode 173, and the drain electrode 175 and the semiconductor layer portions 151 and 154 use the same mask and a same etchant for patterning them. However, in the present exemplary embodiment, an edge of the source electrode 173 adjacent to a channel region may be positioned while being retreated (stepped back by distance L1) from of the hill portion HP of the semiconductor layer 151 according to a process margin. As illustrated in FIG. 2, the edge of the source electrode 173 is retreated by a first width L1 to expose a part of an upper surface of the hill portion HP of the semiconductor layer 151. The first width L1 that is the retreated distance of the edge of the source electrode 173 may correspond to a process variation margin, and the first width L1 may be equal to or less than about 5 μm so as not to exert influence on charge mobility and a characteristic of ON-current of the formed TFT.

When it is assumed that a thickness T1 of the first portion including the hill portion HP of the semiconductor layer 151 has a first thickness value (also denoted here as T1), and a thickness T2 of the second portion of the semiconductor layer 151 has a second thickness value (also denoted here as T2), the first thickness T1 is substantially larger than the second thickness T2 so as to provide for reduced trapping of charged particles (ions) at the semiconductive material to dielectric interface (IF). The thickness of the hill portion HP corresponds to a value obtained by subtracting the second thickness T2 from the first thickness T1. The thickness of the hill portion HP may be equal to or more than about 20 nm and equal to or less than about 200 nm, and may be equal to or less than about 50 nm so as not to exert influence on charge mobility and a threshold characteristic of ON-current.

One gate electrode 124, one source electrode 173, and one drain electrode 175 form one thin film transistor (TFT) together with the projection 154 of the semiconductor layer, and the channel region of the thin film transistor is formed at the projection 154 of the semiconductor layer between the source electrode 173 and the drain electrode 175.

Passivation layers 180a and 180b are formed on the data line 171, on the source electrode 173, on the drain electrode 175, and ton he exposed portion of the projection 154 of the semiconductor layer as shown.

The passivation layers include a lower passivation layer 180a and an upper passivation layer 180b. The lower passivation layer 180a may be formed of a silicon oxide, a silicon nitride, a silicon oxynitride (SiON), or another inorganic layer, and the upper passivation layer 180b may be formed of an organic layer. The upper passivation layer 180b may be omitted.

In the present exemplary embodiment, the lower passivation layer 180a may protrude upwardly from a portion at which the lower passivation layer 180a overlaps the hill portion HP of the semiconductor layer 151. A part of the lower passivation layer 180a rises upwardly by a thickness by which the hill portion HP of the semiconductor layer 151 protrudes upwardly.

A transparent pixel electrode 191 is formed on the passivation layers 180a and 180b. The pixel electrode 191 is physically and electrically connected with the drain electrode 175 through a contact hole 185, and receives data voltage from the drain electrode 175.

Figure 3:
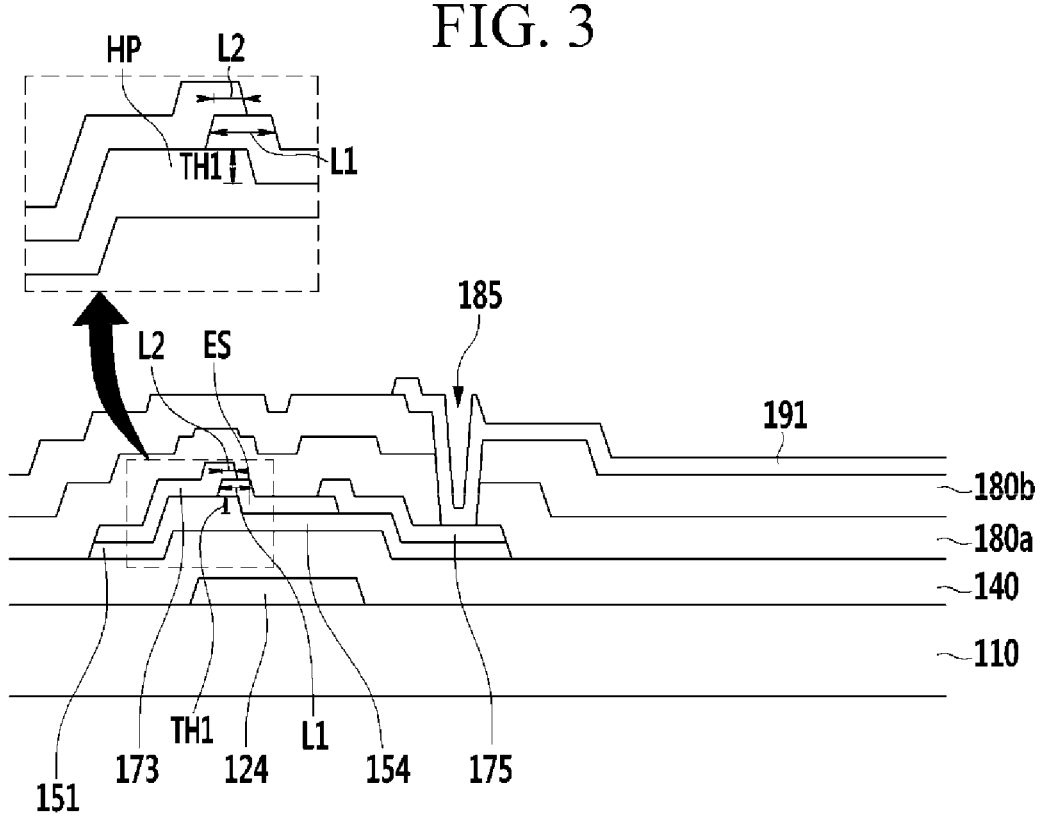
FIG. 3 is a cross-sectional view illustrating the thin film transistor display panel according to another exemplary embodiment.

FIG. 3 is a cross-sectional view illustrating a thin film transistor display panel according to another exemplary embodiment in accordance with the present disclosure of invention. FIG. 3 is a cross-sectional view taken along line II-II' of FIG. 1.

Referring to FIGS. 1 and 3, the plurality of gate lines 121 is formed on the substrate 110 formed of transparent glass or plastic.

The gate lines 121 transmit gate signals, and primarily extend in a horizontal direction. Each gate line 121 includes the plurality of gate electrodes 124 protruding from the gate line 121.

The gate line 121 and the gate electrode 124 may be formed of one selected from aluminum-based metal, such as aluminum (Al) and an aluminum alloy, silver-based metal, such as silver (Ag) and a silver alloy, and copper-based metal, such as copper (Cu) and a copper alloy.

In the present exemplary embodiment, it is described that the gate line 121 and the gate electrode 124 are formed as a single layer, but the gate line 121 and the gate electrode 124 are not limited thereto and may be formed as dual layers, triple layers, or the like.

The gate insulating layer 140 is formed on the gate line 121. The gate insulating layer 140 may be formed of silicon oxide or silicon nitride. In the present exemplary embodiment, it is described that the gate insulating layer 140 is formed in a single layer form, but may be formed in a dual-layer form.

A plurality of semiconductor layers 151 formed of respective one or more semiconductive oxides are formed on the gate insulating layer 140. The semiconductor layers 151 mainly extend in a vertical direction, and include a plurality of respective projections 154 extending about the respective gate electrodes 124.

The semiconductive oxide(s) according to the present exemplary embodiment includes at least one of tantalum (Ta), zinc (Zn), indium (In), tin (Sn), gallium (Ga), and hafnium (Hf).

The aforementioned contents of the thin film transistor display panel according to the present exemplary embodiment are mostly the same as those of the exemplary embodiment described with reference to FIG. 2. However, in the present exemplary embodiment, an etching prevention layer ES is included and positioned between the otherwise exposed channel portion of the elevated projection 154 of the semiconductive region and passivation layer 180a and an uplifted ends of the source and drain electrodes 173/175 as shown. The included etching prevention layer ES may be formed of a silicon-based oxide and/or nitride or another appropriate insulator that protects the top of the channel portion from damage during lithographic patterning. More specifically, the etching prevention capping layer ES serves to prevent silicon oxide ($SiO_2$) or vapor generable during subsequent processes from penetrating into the channel region of the projection 154 of the semiconductor layer. The etching prevention layer ES is formed so as to correspond to the channel region of the projection 154 of the semiconductor layer.

In the present exemplary embodiment, the semiconductor layer 151 again includes the first portion and the second portion having different thicknesses. The first portion of the semiconductor layer 151 corresponds to a portion at which the source electrode 173 and the gate electrode 124 overlap, and the second portion of the semiconductor layer 151 corresponds to a portion at which the drain electrode 175 and the gate electrode 124 overlap. The first portion and the second portion of the semiconductor layer 151 overlap the gate electrode 124, so that the first portion and the second portion of the semiconductor layer 151 are positioned at the projection 154 of the semiconductor layer 151.

As shown in FIG. 3, the first portion of the semiconductor layer 151 includes the hill portion HP protruding upwardly. The hill portion HP of the semiconductor layer 151 is adjacently positioned to the source electrode 173 to which a bias voltage is applied, and is positioned at a portion at which the source electrode 173 and the gate electrode 124 overlap. In this case, a distance between the source electrode 173 and the gate electrode 124 is increased by a thickness of the hill portion HP, and a vertical electrical field, which generated in this portion when a turn-on gate to source bias voltage $V_{gs}=V_{Gon}$ is applied, becomes decreased relative to the field intensity that would there if the hill portion HP were not present, so that trapping of ion charges at the semiconductive material to dielectric interface is decreased. Accordingly, stability of the device may be improved. More specifically, the threshold voltage Vt of the mass produced TFT is less prone to being changed by trapped charges and excessive leakage current $I_{DSleak}$ between the source and drain is therefore less likely to occur when a predetermined turn-off voltage $V_{gs}=V_{Goff}$ is applied.

Referring to FIG. 3 again, one end of the source electrode 173 and one end of the drain electrode 175 are positioned so as to overlap terminal edges of the etching prevention layer ES. The etching prevention layer ES is partially exposed at a position at which the source electrode 173 is spaced apart from the drain electrode 175.

The hill portion HP of the semiconductor layer 151 overlaps the edge of the etching prevention layer ES. One edge of the etching prevention layer ES protrudes upwardly by a thickness of the hill portion HP.

When it is assumed that a thickness of the hill portion HP of the semiconductor layer 151 is a first thickness TH1, that first thickness TH1 may be equal to or more than about 20 nm and equal to or less than about 200 nm, and may be equal to or less than approximately 50 nm so as not to exert influence on charge mobility and a characteristic of ON-current.

Here, when it is assumed that a width of a portion at which the hill portion HP and one edge of the etching prevention layer ES overlap is a first width L1, the first width L1 may be equal to or less than approximately 5 μm so as not to exert influence on charge mobility and a characteristic of ON-current.

Further, when it is assumed that a width of a portion at which the edge of the source electrode 173 and one edge of the etching prevention layer ES overlap is a second width L2, the second width L2 may be equal to or less than approximately 7.5 μm so as not to exert influence on charge mobility and a characteristic of ON-current.

One gate electrode 124, one source electrode 173, and one drain electrode 175 form one thin film transistor (TFT) together with the projection 154 of the semiconductor layer, and the channel region of the thin film transistor is formed at the projection 154 of the semiconductor layer between the source electrode 173 and the drain electrode 175.

The passivation layers 180a and 180b are formed on the data line 171, the source electrode 173, the drain electrode 175, and the ES covered portion of the projection 154 of the semiconductor layer.

The passivation layer includes the lower passivation layer 180a and the upper passivation layer 180b, the lower passivation layer 180a may be formed of a silicon oxide, a silicon nitride, silicon oxynitride (SiON), or an organic layer, and the upper passivation layer 180b may be formed of an organic layer. The upper passivation layer 180b may be omitted.

In the present exemplary embodiment, the lower passivation layer 180a may protrude upwardly from a portion at which the lower passivation layer 180a overlaps the hill portion HP of the semiconductor layer 151. A part of the lower passivation layer 180a rises upwardly by a thickness by which the hill portion HP of the semiconductor layer 151 protrudes upwardly.

A transparent pixel electrode 191 is formed (e.g., of ITO, IZO etc.) on the passivation layers 180a and 180b. The pixel electrode 191 is physically and electrically connected with the drain electrode 175 through the contact hole 185, and receives data voltage from the drain electrode 175.

Figure 4:
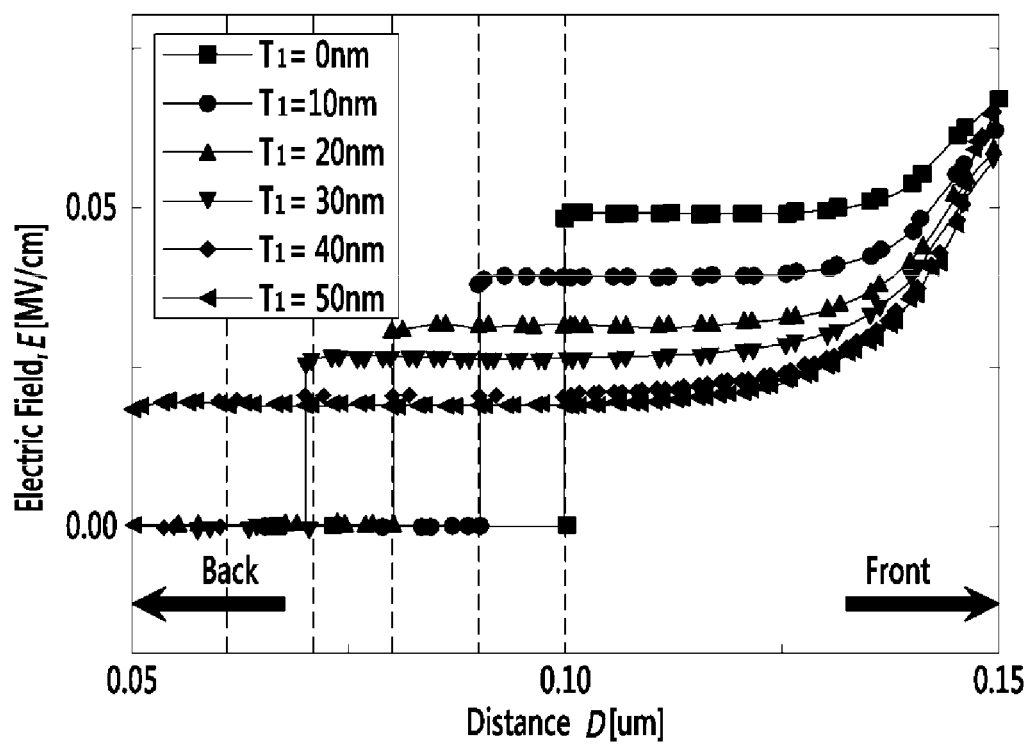
FIG. 4 is a graph illustrating a field change according to a thickness of a hill portion in the thin film transistor of an exemplary embodiment of the present disclosure of invention.

FIG. 4 is a graph illustrating a field intensity change (in terms of millivolts per centimeter) according to a thickness TH1 of the hill portion in the thin film transistor display panel according to the exemplary embodiments of the present disclosure of invention.

Referring to FIG. 4, a distance in a horizontal axis represents a field according to a position of the semiconductor layer. That is, Back corresponds to an upper surface portion of the elevated projection 154 of the semiconductive layer 151, and Front corresponds to a lower surface portion of the projection 154. More particularly, Back corresponds to the surface portion closest to the passivation layer 180a and Front corresponds to the surface portion closest to the gate insulating layer 140.

As can be seen in FIG. 4, as the thickness TH1 of the hill portion increases, the field intensity decreases, and thus a trapping of charged ions at the semiconductive layer to dielectric interface may be decreased and the threshold voltage Vt of the formed TFT may be more reliably established and maintained over operational lifetime.

While this disclosure of invention has been provided in connection with what is presently considered to be practical exemplary embodiments, it is to be understood that the present teachings are not limited to the disclosed embodiments, but, on the contrary, the teachings are intended to cover various modifications and equivalent arrangements included within the spirit and scope of the teachings.

What is claimed is:

1. A thin film transistor display panel, comprising:
   a substrate;
   a gate electrode positioned on the substrate;
   a gate insulating layer positioned on the gate electrode;
   a semiconductor layer positioned on the gate insulating layer and comprising a channel portion; and
   a source electrode and a drain electrode positioned on the semiconductor layer and spaced apart from one another;
   wherein a first portion of the semiconductor layer overlaps both the source electrode and the gate electrode, wherein a second portion of the semiconductor layer overlaps both the drain electrode and the gate electrode, wherein the first portion of the semiconductor layer comprises a hill portion that protrudes, and wherein a thickness of the first portion of the semiconductor layer at a first end of the source electrode is larger than a thickness of the second portion of the semiconductor layer at a first end of the drain electrode.

2. The thin film transistor display panel of claim 1, wherein the source electrode is positioned on the first portion of the semiconductor layer and exposes an edge of the hill portion.

3. The thin film transistor display panel of claim 2, wherein the channel portion is disposed between the source electrode and the drain electrode.

4. The thin film transistor display panel of claim 3, further comprising:
   a passivation layer disposed over the source electrode and the drain electrode;
   wherein a first portion of the passivation layer overlaps the first portion of the semiconductor layer and the first portion of the passivation layer is higher than a second portion of the passivation layer overlapping the second portion of the semiconductor layer.

5. The thin film transistor display panel of claim 4, wherein the passivation layer covers a portion of the semiconductor layer exposed between the source electrode and the drain electrode.

6. The thin film transistor display panel of claim 1, wherein the first end of the source electrode and the first end of the drain electrode are positioned between a second end of the source electrode and a second end of the drain electrode.

7. The thin film transistor display panel of claim 1, wherein the hill portion has a thickness equal to or more than about 20 nm and less than or equal to about 50 nm.

8. The thin film transistor display panel of claim 1, further comprising:
   an etching prevention layer covering the channel portion of the semiconductor layer.

9. The thin film transistor display panel of claim 8, wherein:
   the etching prevention layer overlaps the source electrode and the drain electrode at both edges of the etching prevention layer.

10. The thin film transistor display panel of claim 9, wherein:
    the etching prevention layer overlaps the hill portion of the semiconductor layer.

11. The thin film transistor display panel of claim 10, wherein:
    one edge of the etching prevention layer protrudes upwardly.

12. The thin film transistor display panel of claim 8, wherein:
    an edge of the etching prevention layer is positioned between the hill portion and a terminal edge of the source electrode.

13. The thin film transistor display panel of claim 8, wherein:
    when it is assumed that a thickness of the hill portion is a value obtained by subtracting the thickness of the second portion of the semiconductor layer from the thickness of the first portion of the semiconductor layer, the thickness of the hill portion is equal to or more than about 20 nm and equal to or less than about 50 nm.

14. The thin film transistor display panel of claim 13, wherein:
    a width of a portion at which the one edge of the etching prevention layer overlaps the hill portion of the semiconductor layer is equal to or less than about 5 µm.

15. The thin film transistor display panel of claim 14, wherein:
    a width of a portion at which the edge of the source electrode overlaps the one edge of the etching prevention layer is equal to or less than about 7.5 µm.

16. The thin film transistor display panel of claim 15, wherein:
    the source electrode is positioned on the first portion of the semiconductor layer and exposes the hill portion.

17. The thin film transistor display panel of claim 1, wherein:
    the semiconductor layer comprises a semiconductive oxide.

18. The thin film transistor display panel of claim 1, further comprising:
    a passivation layer disposed over the source electrode and the drain electrode;
    a pixel electrode disposed on the passivation layer, and
    wherein the passivation layer has a contact hole, and the pixel electrode is connected with the drain electrode through the contact hole.

* * * * *